(12) United States Patent
Fujimura et al.

(10) Patent No.: US 6,873,086 B2
(45) Date of Patent: Mar. 29, 2005

(54) PIEZOELECTRIC TRANSFORMER AND STROBE APPARATUS HAVING THE PIEZOELECTRIC TRANSFORMER

(75) Inventors: Takeshi Fujimura, Tokyo (JP); Masaaki Toyama, Saitama (JP); Katsuyuki Ishikawa, Tokyo (JP)

(73) Assignee: Taiheiyo Cement Corporation, Tokyo (JP)

( * ) Notice: Subject to any disclaimer, the term of this patent is extended or adjusted under 35 U.S.C. 154(b) by 0 days.

(21) Appl. No.: 10/868,913

(22) Filed: Jun. 17, 2004

(65) Prior Publication Data

US 2004/0222718 A1 Nov. 11, 2004

Related U.S. Application Data

(62) Division of application No. 10/278,913, filed on Oct. 24, 2002.

(30) Foreign Application Priority Data

Oct. 25, 2001 (JP) ........................................ 2001-327980
Jul. 18, 2002 (JP) ........................................ 2002-210047

(51) Int. Cl.[7] ........................ H01L 41/107; G03B 15/03
(52) U.S. Cl. ..................................................... 310/318
(58) Field of Search ................................ 310/318, 319

(56) References Cited

U.S. PATENT DOCUMENTS 3,598,909 A * 8/1971 Sasaki et al. ................ 348/730
4,054,806 A * 10/1977 Moriki et al. ................ 310/318
5,923,542 A * 7/1999 Sasaki et al. .................. 363/16
5,929,554 A    7/1999 Kanayama et al. .......... 310/359
5,998,909 A   12/1999 Kumasaka et al. .......... 310/348
6,051,915 A    4/2000 Katsuno et al. .............. 310/359
6,564,015 B2 * 5/2003 Fujimura et al. ............ 396/206
6,603,272 B2   8/2003 Kim et al. ............. 315/209 PZ
6,720,705 B2   4/2004 Nakatsuka et al. ..... 310/316.01
6,747,401 B2   6/2004 Hsu et al. .................... 310/359
6,758,199 B2 * 7/2004 Masters et al. .............. 123/620

FOREIGN PATENT DOCUMENTS

| JP | 48-95227 | 12/1973 |
|---|---|---|
| JP | 8-248486 | 9/1996 |
| JP | 10-321927 | 12/1998 |
| JP | 2000-092842 | 3/2000 |
| JP | 2000-321634 | 11/2000 |
| JP | 2000-352744 | 12/2000 |
| JP | 2002-117997 | 4/2002 |
| JP | 2002-196397 | 7/2002 |
| JP | 2002-202551 | 7/2002 |
| JP | 2003-124537 A * | 4/2003 ......... H01L/41/107 |
| WO | WO 97/29521 | 8/1997 |

* cited by examiner

*Primary Examiner*—Thomas M. Dougherty
(74) *Attorney, Agent, or Firm*—Shoemaker and Mattare

(57) ABSTRACT

A strobe apparatus has a discharge capacitor charged by a voltage generated in the output voltage when a piezoelectric transformer is driven in the first resonance mode, and a discharge tube is triggered by a voltage generated in the output electrode when the piezoelectric transformer is driven in the second resonance mode. The transformer has two types of output electrodes and on one surface in the longitudinal direction and two opposing surfaces in the lateral direction. It can be driven by properly switching first and second resonance modes different from each other.

6 Claims, 7 Drawing Sheets

← : POLARIZATION DIRECTION

← : POLARIZATION DIRECTION

PIEZOELECTRIC TRANSFORMER AND STROBE APPARATUS HAVING THE PIEZOELECTRIC TRANSFORMER

This application is a divisional of U.S. application Ser. No. 10/278,913, filed Oct. 24, 2002.

FIELD OF THE INVENTION

The present invention relates to a strobe apparatus suitable for a built-in or detachable strobe apparatus of various cameras.

BACKGROUND OF THE INVENTION

Conventionally, a so-called strobe apparatus which instantaneously illuminates an object to be photographed has been widely used in cameras for taking silver halide pictures and in digital cameras for sensing images by using image sensing devices.

As an example of this strobe apparatus, the present applicant has proposed a strobe apparatus shown in FIG. 6 in Japanese Patent Application No. 2000-395929 and Japanese Patent Application No. 2001-160983 (note, the Japanese Patent Applications are not laid-opened when the present application is filed) including claim of its internal priority, in order to realize a space-saving strobe apparatus with a simple circuit configuration.

That is, this strobe apparatus shown in FIG. 6 roughly comprises a discharge tube (e.g., a xenon discharge tube) 4 for flash, a discharge capacitor 3 which stores electrical energy for allowing the discharge tube 4 to emit light, a charging circuit 1 for charging electrical energy in the discharge capacitor 3, and a trigger circuit 2 which generates a high-voltage signal for causing the discharge tube 4 to discharge.

This circuit has a boosting circuit (11, 12, and 13) which includes a piezoelectric transformer 13 and is shared as a boosting means by the charging circuit 1 and trigger circuit 2. A switch (or switching element) 14 is inserted in series with a line connecting the output of the piezoelectric transformer 13 and the discharge capacitor 3, in order to apply the output voltage from the piezoelectric transformer 13 to the discharge capacitor 3 or discharge tube 4. By properly turning on and off this switch 14, charging of the discharge capacitor 3 and triggering of the discharge tube 4 are realized.

With the above circuit configuration, both the charging function and triggering function can be achieved by only one boosting circuit. Accordingly, a space-saving strove apparatus can be realized.

In the above circuit configuration, however, the high AC voltage (about a few kV) output from the piezoelectric transformer 13 is applied to the switch 14 in accordance with its switching operation. Therefore, it is necessary to use a high-withstand-voltage switching element capable of withstanding this high AC voltage.

Unfortunately, a high-withstand-voltage switching element which can be used, when the present application is filed, as the switch 14 to turn on and off the output voltage of the piezoelectric transformer is expensive and has a relatively large size. This interferes with miniaturization of the strobe apparatus as a whole. To meet demands for further miniaturization of the strobe apparatus, the circuit configuration shown in FIG. 6 is still unsatisfactory.

International Publication (domestic re-publication of PCT international publication) No. WO97/29521 has proposed a plurality of different piezoelectric transformers driven by a one-wave resonance mode, for the purpose of obtaining an output equivalent to those obtained by the conventional piezoelectric transformers by using a piezoelectric transformer smaller than those conventional piezoelectric transformers at an oscillation rate lower than the natural oscillation level limit of the material.

FIG. 7 is a perspective view (corresponding to FIG. 6 of International Publication No. WO97/29521) showing the piezoelectric transformer proposed in International Publication No. WO97/29521. The arrow indicates the polarization direction.

In this publication, a piezoelectric transformer 121 has a primary-side region which occupies ½ in the longitudinal direction of a rectangular plate 123 as a single-plate piezoelectric element. In this primary-side region, surface electrodes 124 and 125 as input electrodes are formed. In a secondary-side region, strip electrodes 126 and 127 as output electrodes are formed in a position which is ¼ in the longitudinal direction of the rectangular plate 123 from the end portion of the region. In addition, an end-face electrode 132 as an output ground electrode is formed at the end face of this secondary-side region.

In this publication, before the piezoelectric transformer 121 having the structure shown in FIG. 7 is driven, one of the surface electrodes 124 or 125, and the end-face electrode 132 are grounded. Consequently, an AC voltage having a frequency whose wavelength is equal to the length of the rectangular plate 123 is applied between the surface electrodes 124 and 125, thereby driving the piezoelectric transformer 121 in a one-wave resonance mode ($\lambda$ mode)

In this piezoelectric transformer 121 driven in the one-wave resonance mode, an output voltage appears in the strip electrodes 126 and 127. This output voltage is extracted from between at least one of the strip electrodes 126 and/or 127, and the grounded one of the surface electrodes 124 or 125, or between at least one of the strip electrodes 126 and/or 127, and the grounded end-face electrode 132. As described in the publication, the connection when this piezoelectric transformer 121 is in operation is used to decrease the oscillation rate and generated heat and increase the efficiency compared to the conventional piezoelectric transformers, as indicated by the above-mentioned purpose.

SUMMARY OF THE INVENTION

The present invention has been proposed to solve the conventional problems (especially, the above-described problem with referred to FIG. 6), and has as its object to provide a piezoelectric transformer which can switch a function of charging a capacitor and a function of triggering a discharge tube without using any switch (switching element), and which can be used as a common boosting means of a charging circuit and trigger circuit, and to provide a strobe apparatus including this piezoelectric transformer.

To achieve the above object, a piezoelectric transformer according to the present invention is characterized by the following arrangement.

That is, this piezoelectric transformer according to the present invention is a piezoelectric transformer having a rectangular shape in which one side in the longitudinal direction forms a primary-side region and the other side forms a secondary-side region, and comprising at least two types of output electrodes, in which a first type of the two types of output electrodes is an electrode formed in an end portion (including the end portion and near by it) of the secondary-side region, and a second type of the two types of output electrodes is an intermediate electrode formed between this end portion and the primary-side region, characterized in that when the piezoelectric transformer is driven in a "first resonance mode", a first output voltage can be extracted from a first output electrode of the two types of output electrodes (22, 23), and, when the piezoelectric transformer is driven in a second resonance mode different from the "first resonance mode", a second output voltage different from the first output voltage can be extracted from a second output electrode of the two types of output electrodes.

In a preferred embodiment, in the secondary-side region of the piezoelectric transformer, the polarization direction in a region between the primary-side region and the intermediate electrode is preferably opposite to the polarization direction in a region between the intermediate electrode and the end portion of the secondary-side region.

In the piezoelectric transformer having the above structure, the primary-side region of the piezoelectric transformer preferably has a layered structure in which a plurality of internal electrodes are connected every other layer by a conductor.

To achieve the above object, a strobe apparatus according to the present invention is a strobe apparatus comprising a discharge tube (4) for flash, a capacitor (3) for storing electrical energy for allowing the discharge tube to emit light, a charging circuit (1A) for charging electrical energy in the capacitor, a trigger circuit (2A) for generating a high-voltage signal for causing the discharge tube to discharger and a boosting circuit including a piezoelectric transformer and shared as boosting means by the charging circuit and the trigger circuit, characterized by comprising the piezoelectric transformer having the above-mentioned structure as the piezoelectric transformer (13A), wherein the boosting circuit can be selectively used for the charging circuit or the trigger circuit by driving the piezoelectric transformer in a first or second resonance mode and extracting output voltages from the two types of output electrodes in the boosting circuit.

Preferably, in the boosting circuit, when the piezoelectric transformer is driven in the first resonance mode (e.g., a 5/2-wave mode), the capacitor is charged by the first output voltage extracted from the first output electrode of the two types of output electrodes, and, when the driving state is switched from the "first resonance mode" to the second resonance mode, the piezoelectric transformer is driven in the second resonance mode (e.g., a 1/2-wave mode or one-wave mode), and the discharge tube is triggered by the second output voltage extracted from the second output electrode.

In a preferred embodiment, the strobe apparatus is preferably a built-in or detachable strobe apparatus of a camera, and, in the boosting circuit the first and second resonance modes are preferably switched in accordance with a shutter operation of the camera.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of a piezoelectric transformer and a strobe apparatus having this piezoelectric transformer according to the present invention will now be described in detail in accordance with the accompanying drawings.
<Piezoelectric Transformer>

Figure 1A:
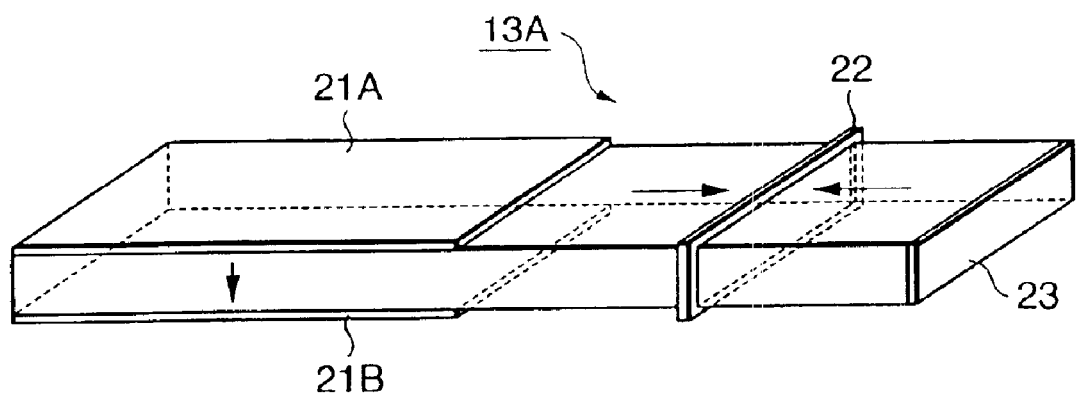
FIGS. 1A and 1B are views showing a piezoelectric transformer according to an embodiment.
Figure 1B:
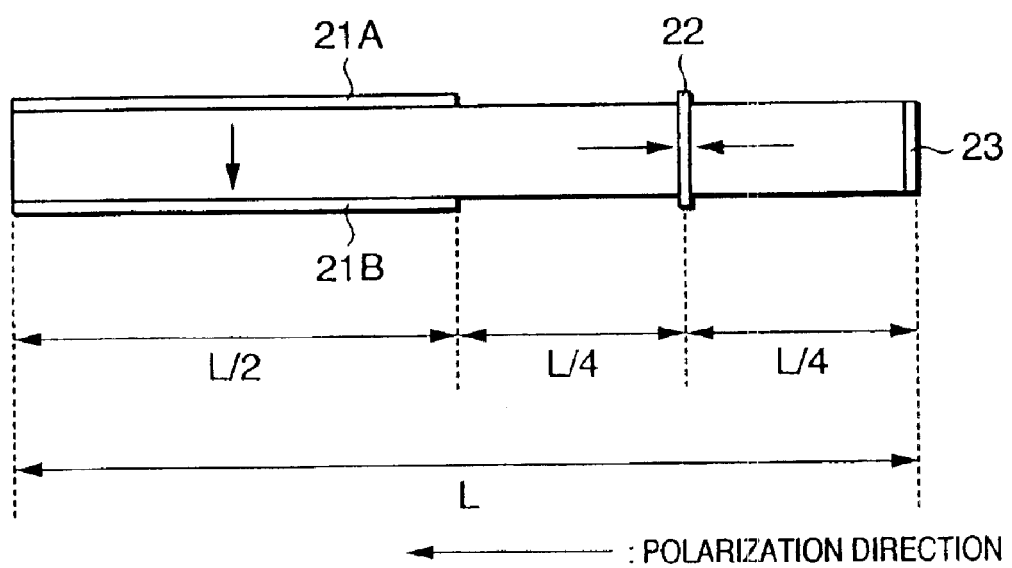

FIGS. 1A and 1B are views showing a piezoelectric transformer according to this embodiment. FIG. 1A is a perspective view of the piezoelectric transformer, and FIG. 1B is a front view in which this piezoelectric transformer shown in FIG. 1A is viewed front ways. In FIGS. 1A and 1B, the arrows represent the polarization direction.

A piezoelectric transformer 13A shown in FIGS. 1A and 1B has, for example, a rectangular shape whose length L in the longitudinal direction is 30 mm. In a primary-side region on the left side, input electrodes 21A and 21B are formed to form this primary-side region as a boosting transformer in this position.

In this embodiment, of the six surfaces forming the shape of the piezoelectric transformer 13A, an output electrode 23 is formed on one surface (end face) in the longitudinal direction of this piezoelectric transformer 13A. In the lateral direction, an output electrode 22 is formed in a position which is, e.g., L/4 in the longitudinal direction from the output electrode 23. This output electrode 22 surrounds two pairs of opposing surfaces (side surfaces)

In the piezoelectric transformer 13A having this shape, the primary-side region is polarized from the input electrode 21A to the input electrode 21B. Also, as shown in FIGS. 1A and 1B, a secondary-side region of this piezoelectric transformer 13A is polarized from the output electrode 23 to the output electrode 22, and from the input electrodes 21A and 21B to the output electrode 22.

This secondary-side region can also be polarized from the output electrode 22 to the output electrode 23, and from the output electrode 22 to the input electrodes 21A and 21B, in directions opposite to the polarization directions shown in FIGS. 1A and 1B. This similarly applies to piezoelectric transformers in modifications to be explained later.

Table 1 is a list showing the relationships between output voltages extractable from the two different output electrodes 22 and 23 of the piezoelectric transformer 13A and its resonance modes. More specifically, [Table 1] shows output voltages extractable when this piezoelectric transformer 13A is driven in a λ/2 mode, λ mode, and 3 λ/2 mode (λ represents the wavelength).

TABLE 1

| Resonance Mode | Driving Frequency (kHz) | Output Voltage V2 (Output Electrode 22) (kV) | Output Voltage V1 (Output Electrode 23) (kV) |
|---|---|---|---|
| λ/2 | 54 | 2.9 | 1.2 |
| λ | 108 | 2.1 | 0.1 or less |
| 3 λ/2 | 162 | 0.1 or less | 1.4 |

As shown in [Table 1], when the piezoelectric transformer 13A is driven in the λ/2 mode in which a driving frequency fd is 54 kHz, an output voltage V1 extractable from the output electrode 23 at the end face is 1.2 kV, and an output voltage V2 extractable from the output electrode 22 is 2.9 kV.

When the piezoelectric transformer 13A is driven in the λ mode in which the driving frequency fd is 108 kHz, the output voltage V1 extractable from the output electrode 23 at the end face is 0.1 kV or less, and the output voltage V2 extractable from the output electrode 22 is 2.1 kV.

When the piezoelectric transformer 13A is driven in the 3 λ/2 mode in which the driving frequency fd is 162 kHz, the output voltage V1 extractable from the output electrode 23 at the end face is 1.4 kV, and the output voltage V2 extractable from the output electrode 22 is 0.1 kV or less.

When the λ/2 mode and λ mode are combined as a "first resonance mode" and "second resonance mode", respectively, or the 3 λ/2 mode and λ mode are combined as the "first resonance mode" and second resonance mode , respectively, the operation characteristics of the piezoelectric transformer 13A can be objectively expressed as: when the piezoelectric transformer is driven in the "first resonance mode", the first output voltage can be extracted from the first output electrode; when the piezoelectric transformer is driven in the "second resonance mode" different from the first resonance mode, the second output voltage different from the first output voltage can be extracted from the second output electrode.

In the preferred embodiment, the primary-side region of the piezoelectric transformer 13A favorably has a layered structure in which a plurality of internal electrodes are connected every other layer by an interlayer connecting conductor formed inside or outside this primary-side region, in order to raise the boosting ratio. When this interlayer connecting conductor is formed outside the primary-side region, the input electrodes 21A and 21B need not be formed in the position as shown in FIGS. 1A and 1B. That is, this interlayer connecting conductor itself can be used as an input electrode.

In this embodiment, the output electrode 22 is so formed as to surround the two pairs of surfaces (side surfaces) in the lateral direction. However, the present invention is not restricted to this structure, and the output electrode 22 need only be formed between the output electrode 23 and the primary-side region. For example, similar to the input electrodes 21A and 21B, output electrodes can also be formed on two side surfaces opposing each other in the vertical direction (the direction of thickness) in FIGS. 1A and 1B.

The structure of the secondary-side region of this piezoelectric transformer 13A can also be a layered structure in which, in a position which is substantially L/4 from the output electrode 23 at the end face, a plurality of internal electrodes are connected by an interlayer connecting conductor formed inside or outside this secondary-side region. When this interlayer connecting conductor is formed outside the secondary-side region, the output electrode 22 having the shape as shown in FIGS. 1A and 1B need not be formed. That is, this interlayer connecting conductor itself can be used as an output electrode.

The output electrode 23 need not be formed at the end face of the secondary-side region, and can also have a layered structure which is formed inside the secondary-side region near the end face and in which a plurality of internal electrodes are connected by an interlayer connecting conductor formed inside or outside this secondary-side region. When this interlayer connecting conductor is formed outside the secondary-side region, the output electrode 23 having the shape as shown in FIGS. 1A and 1B need not be formed. That is, this interlayer connecting conductor itself can be used as an output electrode.

That is, the piezoelectric transformer according to this embodiment has a rectangular shape in which the primary-side region is formed on one side in the longitudinal direction and the secondary-side region is formed on the other side. This piezoelectric transformer need not have the same structure as the piezoelectric transformer 13A shown in FIGS. 1A and 1B, provided that an electrode structure (the output electrode 23 in the piezoelectric transformer 13A) from which the output voltage V1 can be extracted is formed at the end face of the secondary-side region or in the vicinity of this end face (i.e., in the end portion of the secondary-side region), and that an intermediate electrode (the output electrode 22 in the piezoelectric transformer 13A) from which the output voltage V2 can be extracted is formed between this end portion and the primary-side region. Practical modifications will be explained below.

<Modifications of Piezoelectric Transformer>

Figure 3A:
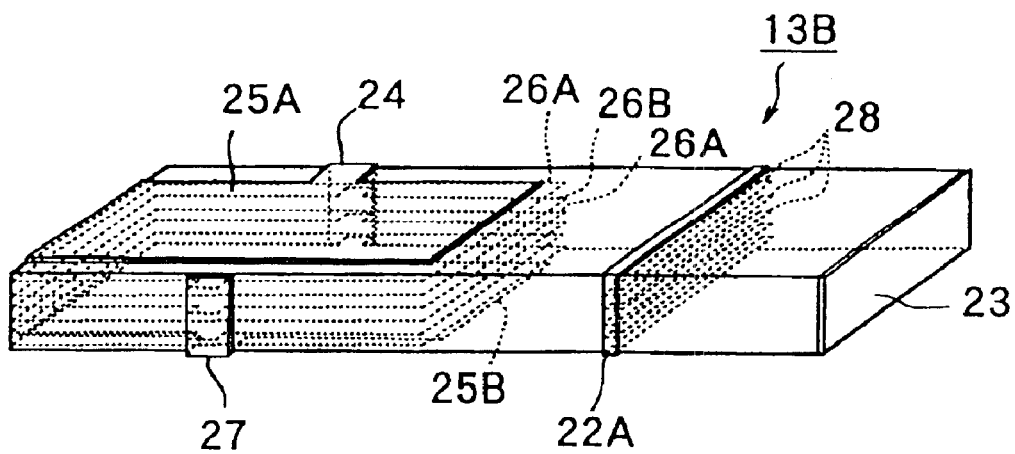
FIGS. 3A and 3B are views showing a piezoelectric transformer according to the first modification of the embodiment.
Figure 3B:
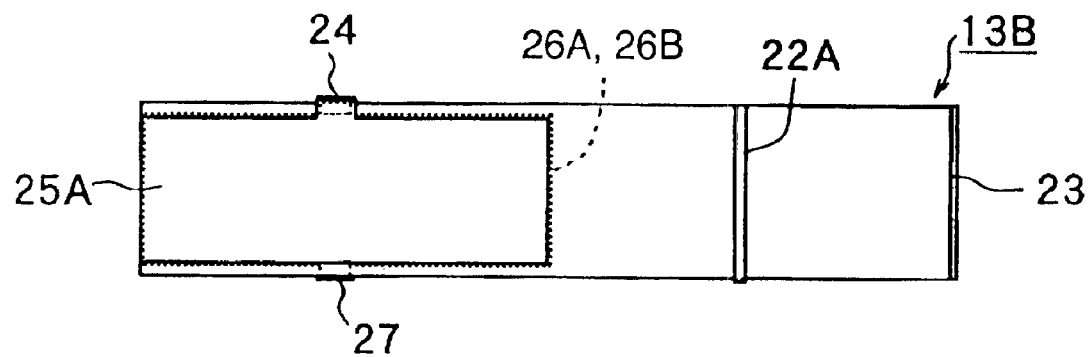

FIGS. 3A and 3B are views showing a piezoelectric transformer according to the first modification of this embodiment. FIG. 3A is a perspective view of the piezoelectric transformer, and FIG. 3B is a front view in which this piezoelectric transformer shown in FIG. 3A is viewed front ways.

In a primary-side region of this piezoelectric transformer 13B shown in FIGS. 3A and 3B, an input electrode 25A and an input electrode 25B (not shown) are formed to vertically oppose each other. Also, a plurality of internal electrodes 26A and 26B are alternately stacked inside this primary-side region. The internal electrodes 26A inside the primary-side region are connected to an interlayer connecting conductor 27 formed on one side surface. This interlayer connecting conductor 27 is connected to the input electrode 25B (not shown). The internal electrodes 26B inside the primary-side region are connected to an interlayer connecting conductor 24 formed on the other side surface. This interlayer connecting conductor 24 is connected to the input electrode 25A.

In this piezoelectric transformer 13B, an output electrode 23 is formed at the end face of a secondary-side region, similar to the structure shown in FIGS. 1A and 1B. Between this output electrode 23 and the primary-side region, a plurality of internal electrodes 28 are connected to an interlayer connecting conductor 22A which also functions as an output electrode.

By driving this piezoelectric transformer 13B having the above structure by using a driving circuit similar to that of the piezoelectric transformer 13A shown in FIGS. 1A and 1B, output voltages different in magnitude can be extracted from the interlayer connecting conductor 22A and output electrode 23.

Figure 4A:
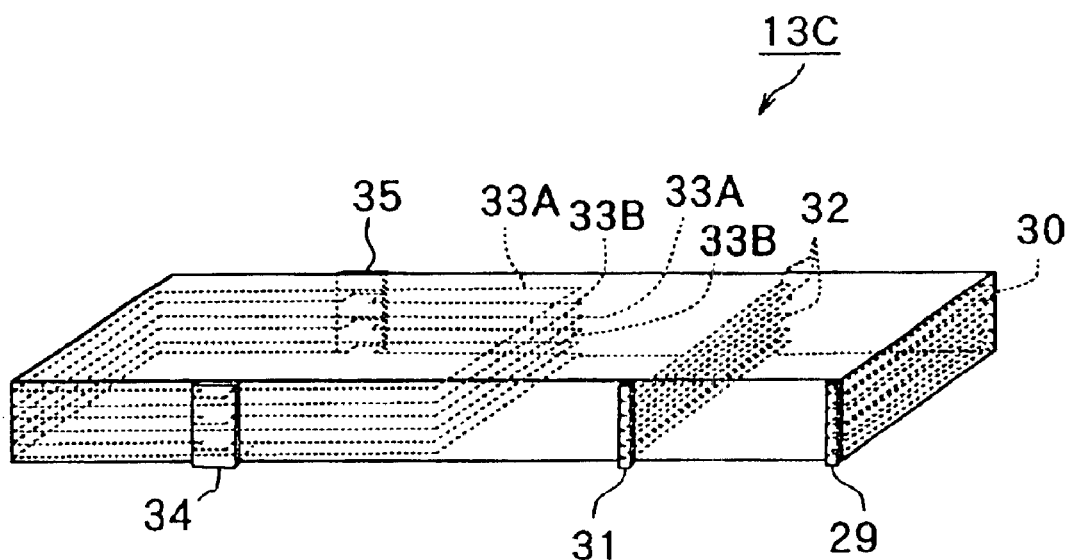
FIGS. 4A and 4B are views showing a piezoelectric transformer according to the second modification of the embodiment.
Figure 4B:
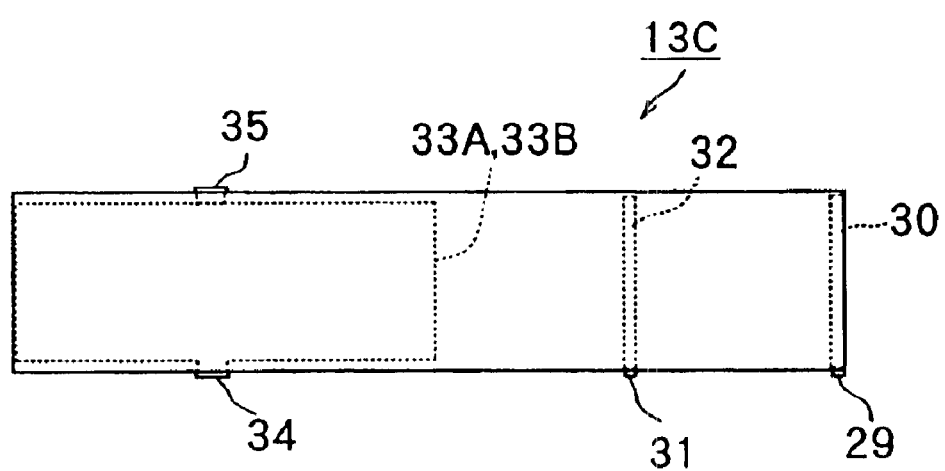

FIGS. 4A and 4B are views showing a piezoelectric transformer according to the second modification of this embodiment. FIG. 4A is a perspective view of the piezoelectric transformer, and FIG. 4B is a front view in which this piezoelectric transformer shown in FIG. 4A is viewed front ways.

Inside a primary-side region of this piezoelectric transformer 13C shown in FIGS. 4A and 4B, a plurality of internal electrodes 33A and 33B are alternately stacked. The internal electrodes 33A inside the primary-side region are connected to an interlayer connecting conductor 34 formed on one side surface. The internal electrodes 33B inside the primary-side region are connected to an interlayer connecting conductor 35 formed on the other side surface.

Near the end face of a secondary-side region of this piezoelectric transformer 13C, a plurality of internal electrodes 30 are connected to an interlayer connecting conductor 29 which also functions as an output electrode. Between these internal electrodes 30 and the primary-side region, a plurality of internal electrodes 32 are connected to an interlayer connecting conductor 31 which also functions as an output electrode.

By driving this piezoelectric transformer 13C having the above structure by using a driving circuit similar to that of the piezoelectric transformer 13A shown in FIGS. 1A and 1B, output voltages different in magnitude can be extracted from the interlayer connecting conductors 30 and 31.

Figure 5A:
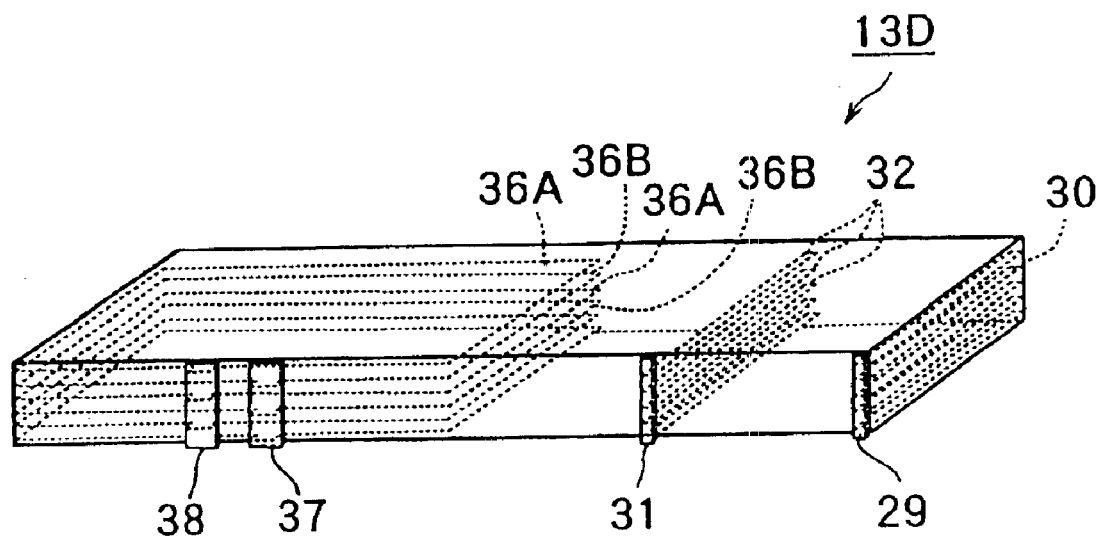
FIGS. 5A and 5B are views showing a piezoelectric transformer according to the third modification of the embodiment.
Figure 5B:
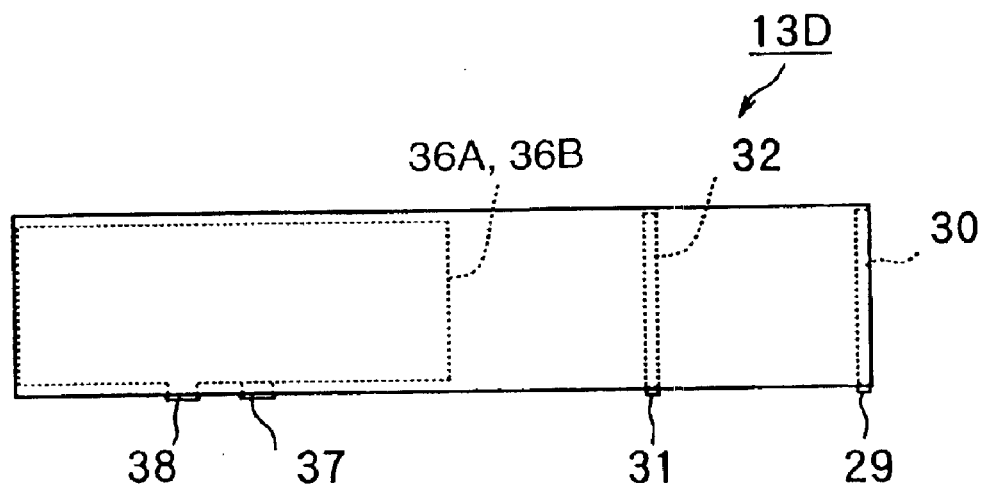

FIGS. 5A and 5B are views showing a piezoelectric transformer according to the third modification of this embodiment. FIG. 5A is a perspective view of the piezoelectric transformer, and FIG. 5B is a front view in which this piezoelectric transformer shown in FIG. 5A is viewed front ways.

In this piezoelectric transformer 13D shown in FIGS. 5A and 5B, a primary-side region has substantially the same structure as the piezoelectric transformer 13C shown in FIGS. 4A and 4B, except that interlayer connecting conductors 37 and 38 which also function as input electrodes are formed on one side surface of the piezoelectric transformer 13D.

Also, in this piezoelectric transformer 13D, a secondary-side region has substantially the same structure as the piezoelectric transformer 13C shown in FIGS. 4A and 4B.

By driving this piezoelectric transformer 13D having the above structure by using a driving circuit similar to that of the piezoelectric transformer 13A shown in FIGS. 1A and 1B, output voltages different in magnitude can be extracted from interlayer connecting conductors 30 and 31.

Note that presently general methods can be used as the methods of manufacturing the piezoelectric transformer 13A having the shape shown in FIGS. 1A and 1B and manufacturing the piezoelectric transformers 13B to 13D according to the aforementioned modifications, and as the methods of forming the layered structures in the primary-side region and/or the secondary-side region of these piezoelectric transformers. Therefore, a detailed explanation of these methods will be omitted in this embodiment. <Strobe Apparatus>

A strobe apparatus including the piezoelectric transformer 13A as a boosting means will be described below. In the following description, a strobe apparatus in which the piezoelectric transformer 13A as described above is driven in the λ/2 mode as the "first resonance mode" and the λ mode as the "second resonance mode", and a strobe apparatus in which this piezoelectric transformer 13A is driven in the 3 λ/2 mode as the "first resonance mode" and the I mode as the "second resonance mode", will be explained.

Figure 2:
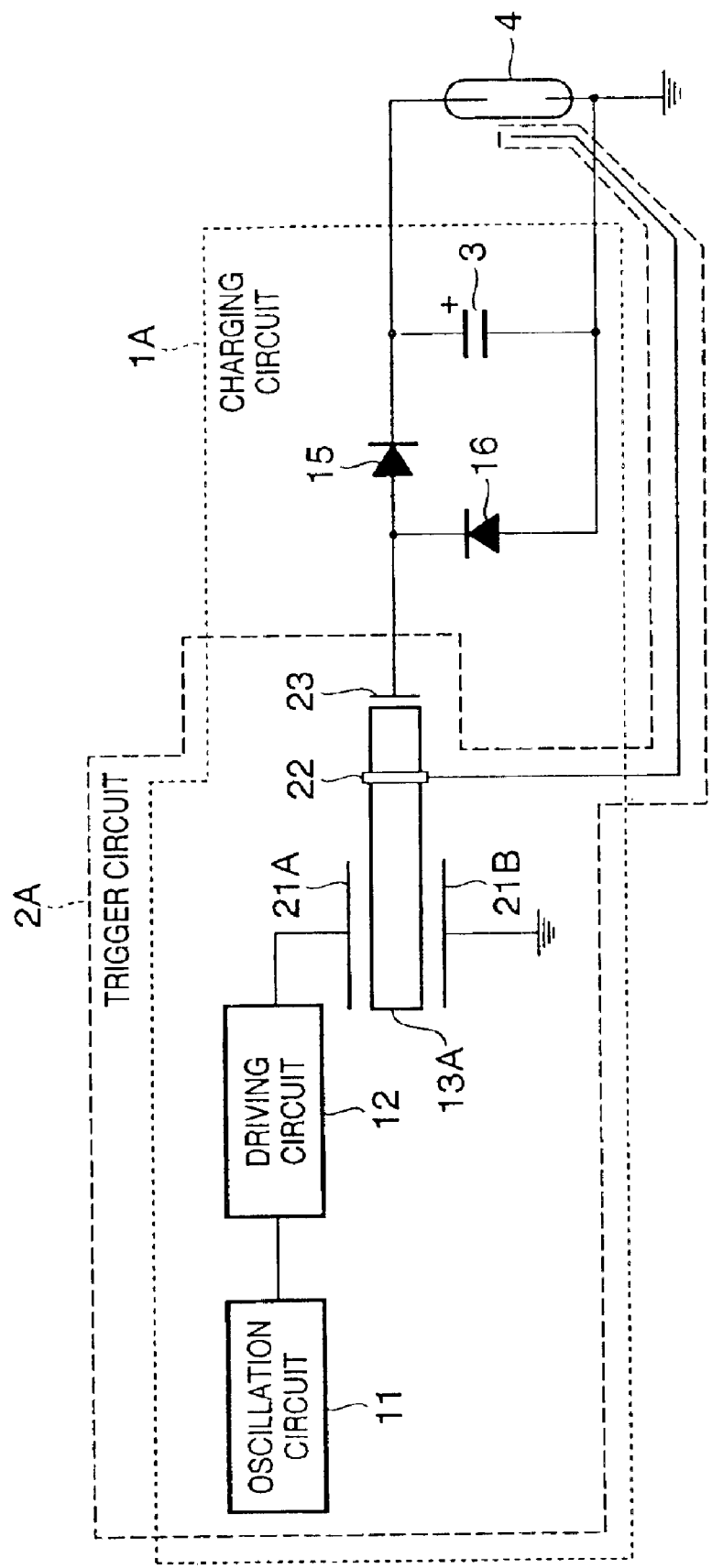
FIG. 2 is a block diagram showing the circuit configuration of a strobe apparatus according to the embodiment.

FIG. 2 is a block diagram showing the circuit configuration of the strobe apparatus according to this embodiment.

This strobe apparatus shown in FIG. 2 roughly comprises a discharge tube (e.g., a xenon discharge tube) 4 for flash, a discharge capacitor 3 which stores electrical energy for allowing the discharge tube 4 to emit light, a charging circuit 1A for charging electrical energy in the discharge capacitor 3, and a trigger circuit 2A which generates a high-voltage signal for causing the discharge tube 4 to discharge.

The charging circuit 1A and trigger circuit 2A have, as a common boosting means, a boosting circuit which includes an oscillation circuit 11, a driving circuit 12, and the piezoelectric transformer 13A. The driving circuit 12 drives the piezoelectric transformer 13A in accordance with an oscillation signal having a predetermined frequency which is output from the oscillation circuit 11.

In this embodiment, the oscillation circuit 11 can output at least two types of oscillation signals having different frequencies, as the predetermined frequency described above. On the basis of this oscillation signal and an externally applied predetermined DC voltage, the driving circuit 12 supplies at least two types of driving signals having different frequencies to the input electrodes 21A and 21B. In this way, the piezoelectric transformer 13A can be driven in either of the two different resonance modes (the "first resonance mode" or "second resonance mode")

In the charging circuit 1A, two diodes 15 and 16 form a general rectifying circuit. When the piezoelectric transformer 13A is driven in the "first resonance mode", the output voltage V1 from the output electrode 23 is applied to this rectifying circuit. The discharge capacitor 3 charges the electrical energy of the rectified voltage (DC voltage) for discharge of the discharge tube 4.

On the other hand, when the piezoelectric transformer 13A is driven in the "second resonance mode" in the trigger circuit 2A, the output voltage V2 from the output electrode 22 is applied to the trigger terminal of the discharge tube 4. If the discharge capacitor 3 is in a predetermined charged state, the discharge tube 4 flashes by the electrical energy charged in the discharge capacitor 3 by using the output voltage V2 applied to the trigger terminal of this discharge tube 4 as a trigger.

Note that presently general devices can be used in the individual circuit configurations of the oscillation circuit 11, the driving circuit 12, and the rectifying circuit having the rectifying diodes 15 and 16. Therefore, a detailed explanation of these circuits will be omitted in this embodiment.

First, a strobe apparatus in which the piezoelectric transformer 13A is driven in the λ/2 mode as the "first resonance mode" and the λ mode as the "second resonance mode" will be described below.

In this strobe apparatus, when the piezoelectric transformer 13A is driven in the λ/2 mode as the "first resonance mode", the discharge capacitor 3 is charged by output voltage V1=1.2 kV from the output electrode 23, in accordance with the characteristics shown in [Table 1]. A charging voltage required for the discharge tube 4 is 300 V in this embodiment, and the voltage generated in the output electrode 23 at that time is also substantially 300 V. Hence., from the voltage ratio (2.9/1.2) shown in [Table 1], the output voltage V2 from the output electrode 22 is 725 V. Since this value of the output voltage V2 is smaller than a predetermined trigger voltage (in this embodiment, 1 kV), the discharge tube 4 does not flash.

When the piezoelectric transformer 13A is driven in the λ mode as the "second resonance mode" after that, the output voltage V2 from the output electrode 22 increases from 0.725 to 2.1 kV in accordance with the characteristics shown in [Table 1]. If the discharge capacitor 3 is in a predetermined charged state, the discharge tube 4 flashes by the electrical energy charged in the discharge capacitor 3, since the output voltage V2 exceeds the predetermined trigger voltage of this discharge tube 4.

A strobe apparatus in which the piezoelectric transformer 13A is driven in the 3 λ/2 mode as the "first resonance mode" and the λ mode as the "second resonance mode" will be described next.

In this strobe apparatus, when the piezoelectric transformer 13A is driven in the 3 λ/2 mode as the "first resonance mode", the discharge capacitor 3 is charged by output voltage V1=1.4 kV from the output electrode 23, in accordance with the characteristics shown in [Table 1]. However, the discharge tube 4 does not flash because the output voltage V2 from the output electrode 22 at that time is 0.1 kV or less, i.e., smaller than the predetermined trigger voltage.

When the piezoelectric transformer 13A is driven in the λ mode as the "second resonance mode" after that, the output voltage V2 from the output electrode 22 increases from 0.1 kV or less to 2.1 kV in accordance with the characteristics shown in [Table 1] If the discharge capacitor 3 is in a predetermined charged state, the discharge tube 4 flashes by the electrical energy charged in the discharge capacitor 3, since the output voltage V2 exceeds the predetermined trigger voltage of this discharge tube 4.

Note that when the piezoelectric transformer 13A is to be driven in the λ mode and 3 λ/2 mode, the connection (wiring)-arrangement of the strobe apparatus can be changed from those shown in FIG. 2. That is, the output electrode 22 is connected to the charging line of the discharge capacitor 3, and the output electrode 23 is connected to the trigger terminal of the discharge tube 4. In this manner, the piezoelectric transformer 13A can also be driven in the λ mode as the "first resonance mode" and the 3 λ/2 mode as the "second resonance mode".

In the strobe apparatus of this embodiment as described above, when the piezoelectric transformer 13A is driven in the "first resonance mode", the discharge capacitor 3 is charged by the first output voltage from the first output electrode of the two output electrodes 22 and 23. When the resonance mode is switched from the "first resonance mode" to the "second resonance mode", the piezoelectric transformer 13A is driven in this "second resonance mode". Consequently, the discharge tube 4 can be triggered by the second output voltage extracted from the second output electrode. That is, by thus switching the resonance modes of the piezoelectric transformer 13A, it is possible to perform switching between the application of the first output voltage to the discharge capacitor 3 and the application of the second output voltage to the trigger terminal of the discharge tube 4. This allows the charging circuit 1A and trigger circuit 2A to share one boosting circuit.

Figure 6:
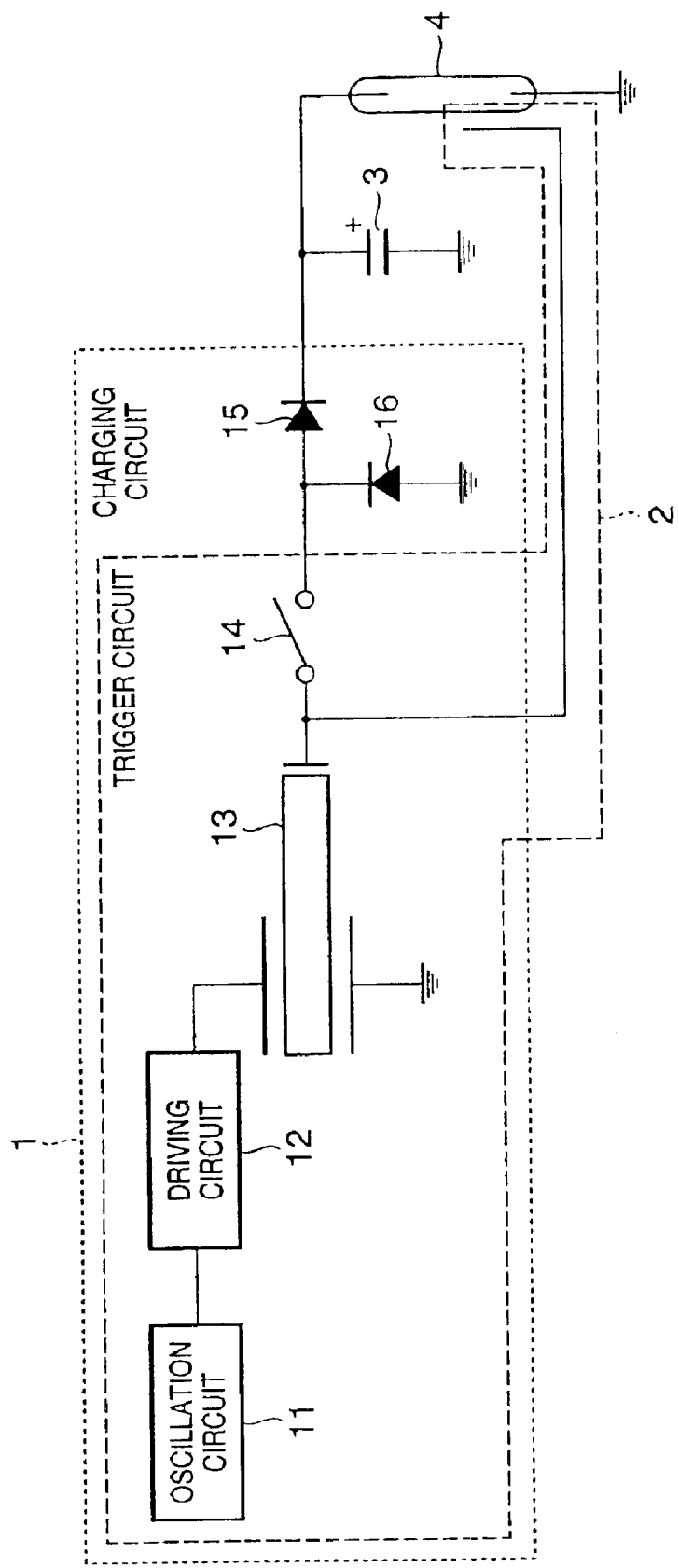
FIG. 6 is a block diagram showing the circuit configuration of a strobe apparatus previously proposed by the present applicant.
Figure 7:
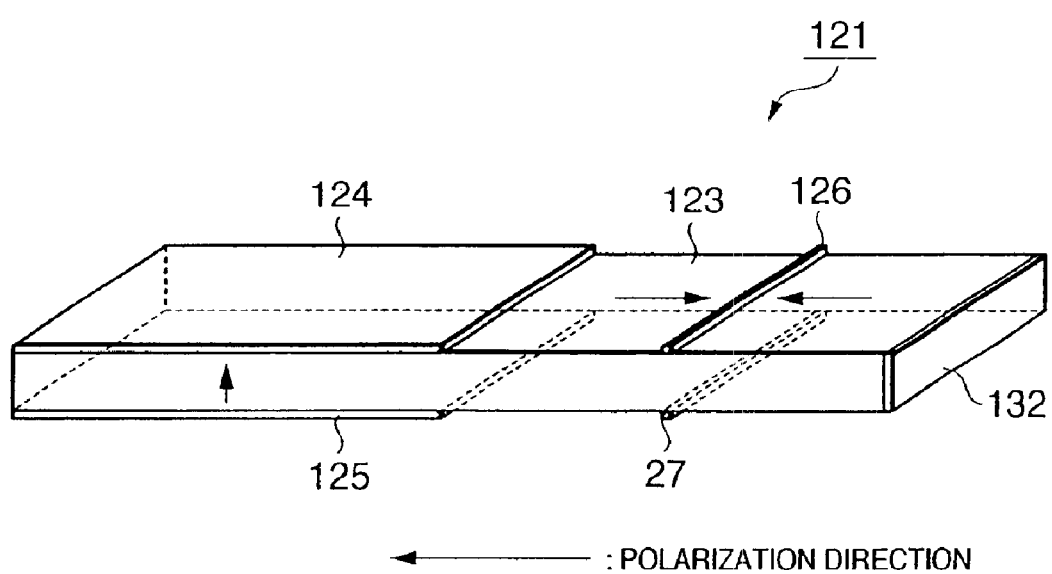
FIG. 7 is a perspective view showing a piezoelectric transformer proposed in International Publication No. WO97/29521.

In this embodiment as described above, by noting the characteristic of a piezoelectric transforming element that the boosting ratio (output voltage) changes in accordance with the magnitude of the load, a single piezoelectric transformer is used for two purposes (charging of the discharge capacitor 3 and discharge triggering of the discharge tube 4). In addition, one boosting circuit is also used for these two purposes. This circuit configuration is the same as the strobe apparatus shown in FIG. 6. However, this embodiment, in the circuit configuration of the strobe apparatus as shown in FIG. 2, uses the method unique to the present application by which the two output voltages V1 and V2 obtained form the output electrodes 22 and 23 are selectively used by properly switching the resonance modes by using the piezoelectric transformer 13A shown in FIGS. 1A and 1B. This makes it possible to appropriately switch the function of charging the discharge capacitor 3 and the function of triggering the discharge tube 4 without using the switch (switching element) that is necessary in the strobe apparatus explained earlier with reference to FIG. 6.

Accordingly, this embodiment can realize a space-saving strobe apparatus with a simple arrangement and can be suitably used as a built-in or detachable strobe apparatus of various cameras. In this strobe apparatus, the two resonance modes can be switched in accordance with a shutter operation of the camera, e.g., by changing the frequency of the oscillation signal which the oscillation circuit 11 supplies to the driving circuit 12.

In the above explanation of the strobe apparatus, the piezoelectric transformer 13A (FIGS. 1A and 1B) is used as an example of the boosting means. However, the present invention is not limited to this apparatus arrangement. That is, the strobe apparatus can also include, as the boosting means, any of the piezoelectric transformer 13B (FIGS. 3A and 3B), piezoelectric transformer 13C (FIGS. 4A and 4B), and piezoelectric transformer 13D (FIGS. 5A and 5B) described in the modifications. <Example>

During the course of repetitive verification of the strobe apparatus having the apparatus arrangement explained in the above embodiment, the present applicant also conducted an experiment by using resonance modes other than the λ/2 mode, λ mode, and 3 λ/2 mode described above. Therefore, explanation and consideration of the experimental results will be described below as an example based on the embodiment of the present application.

Table 2 is a list showing the relationships between output voltages extractable from the two different output electrodes 22 and 23 of the piezoelectric transformer 13A and its resonance modes. More specifically, [Table 2] shows output voltages extractable when this piezoelectric transformer 13A was driven in higher-order resonance modes, i.e., a 2 λ mode, 5 λ/2 mode, and 3λ mode, in addition to the above-mentioned three resonance modes (λ/2 mode, λ mode, and 3 λ/2 mode) (λ represents the wavelength).

The piezoelectric transformer 13A used in this example had a rectangular shape whose dimension L in the longitudinal direction was 20 mm and dimension (width) W in the lateral direction was 5 mm. In the experiment, the output voltages V1 and V2 were measured in the individual resonance modes by connecting a load resistance of 100 kΩ to the output side for charging the discharge capacitor 3 of the piezoelectric transformer 13A (i.e., between the output electrode 23 and input electrode 21B) in the circuit configuration of the strobe apparatus shown in FIG. 2.

TABLE 2

| Resonance Mode | Driving Frequency (kHz) | Output Voltage V2 (kHz) (Output Electrode 22) | Output Voltage V1 (kHz) (Output Electrode 23) |
| --- | --- | --- | --- |
| λ/2 λ 3 λ/2 2 λ | 84 166 239 330 | 2.0 2.4 0.2 | 0.8 0.6 0.6 |
| 5 λ/2 3 λ | 427 514 | 1.8 0.3 1.2 | 0.9 1.7 0.9 |

As a result of the experiment based on the specification and conditions described above, as shown in [Table 2], when the piezoelectric transformer 13A was driven in the 5 λ/2 mode in which the driving frequency fd was 427 kHz, the output voltage V1 extractable from the output electrode 23 at the end face was 1.7 kV. By contrast, in [Table 2] the output voltages V1 in the resonance modes except for the 5 λ/2 mode and at the driving frequencies of these resonance modes are much smaller than the output voltage V1 in the 5 λ/2 mode.

That is, the above experimental results indicate the following. When the strobe apparatus having the circuit configuration shown in FIG. 2 is to be driven by using the piezoelectric transformer 13A with the specification described above, the output voltage V1 is larger when the piezoelectric transformer 13A is driven in the 5 λ/2 mode as the "first resonance mode" in which the discharge capacitor 3 is charged, than when the piezoelectric transformer 13A is driven in the other resonance modes shown in [Table 2]. This can minimize the time (charging rate) required before the discharge capacitor 3 is charged to a predetermined charging voltage (in this experiment, 300 V), indicating that driving in the 5 λ/2 mode is favorable.

The output voltage V1 is highest in the 5 λ/2 mode as shown in [Table 2]. The main reason for this is presumably the impedance of the piezoelectric transformer 13A itself.

The embodiment and example described above can provide a piezoelectric transformer which can switch a function of charging a capacitor and a function of triggering a discharge tube without using any switch (switching element), and which can be used as a common boosting means of a charging circuit and trigger circuit, and can also provide a strobe apparatus including this piezoelectric transformer.

As many apparently widely different embodiments of the present invention can be made without departing from the spirit and scope thereof, it is to be understood that the invention is not limited to the specific embodiments thereof except as defined in the appended claims.

What is claimed is:

1. A strobe apparatus comprising a discharge tube for flash, a capacitor for storing electrical energy for allowing said discharge tube to emit light, a charging circuit for charging electrical energy in said capacitor, a trigger circuit for generating a high-voltage signal for causing said discharge tube to discharge, and a boosting circuit including a piezoelectric transformer and shared as boosting means by said charging circuit and said trigger circuit, comprising:

a piezoelectric transformer, as said piezoelectric transformer, having a rectangular shape in which one side in the longitudinal direction forms a primary-side region and the other side forms a secondary-side region, and comprising at least two types of output electrodes, in which a first type of the two types of output electrodes is an electrode formed in an end portion of the secondary-side region, and a second type of the two types of output electrodes is an intermediate electrode formed between this end portion and the primary-side region, wherein when said piezoelectric transformer is driven in a first resonance mode, a first output voltage can be extracted from a first output electrode of said two types of output electrodes, and, when said piezoelectric transformer is driven in a second resonance mode different from the first resonance mode, a second output voltage different from the first output voltage can be extracted from a second output electrode of said two types of output electrodes, and wherein said boosting circuit can be selectively used for said charging circuit or said trigger circuit by driving said piezoelectric transformer in a first or second resonance mode and extracting output voltages from said two types of output electrodes in said boosting circuit.

2. The apparatus according to claim 1, wherein, in said boosting circuit, when said piezoelectric transformer is driven in the first resonance mode, said capacitor is charged by the first output voltage extracted from said first output electrode of said two types of output electrodes, and, when the driving state is switched from the first resonance mode to the second resonance mode, said piezoelectric transformer is driven in the second resonance mode, and said discharge tube is triggered by the second output voltage extracted from said second output electrode.

3. The apparatus according to claim 1, wherein said strobe apparatus is a built-in or detachable strobe apparatus of a camera, and in said boosting circuit, the first and second resonance modes are switched in accordance with a shutter operation of the camera.

4. The apparatus according to claim 2, wherein said boosting circuit drives said piezoelectric transformer in a 5/2-wave mode in order to charge said capacitor in the first resonance mode.

5. The apparatus according to claim 2, wherein said boosting circuit drives said piezoelectric transformer in a 1/2-wave mode or one-wave mode in order to trigger said discharge tube in the second resonance mode.

6. The apparatus according to claim 2, wherein said strobe apparatus is a built-in or detachable strobe apparatus of a camera, and in said boosting circuit, the first and second resonance modes are switched in accordance with a shutter operation of the camera.

* * * * *